US009583647B2

(12) United States Patent
Komori et al.

(10) Patent No.: US 9,583,647 B2
(45) Date of Patent: Feb. 28, 2017

(54) SOLAR CELL ELEMENT

(71) Applicant: PANASONIC INTELLECTUAL PROPERTY MANAGEMENT CO., LTD., Osaka (JP)

(72) Inventors: Tomoyuki Komori, Osaka (JP); Hidekazu Arase, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 484 days.

(21) Appl. No.: 14/152,409

(22) Filed: Jan. 10, 2014

(65) Prior Publication Data

US 2014/0124032 A1 May 8, 2014

Related U.S. Application Data

(63) Continuation of application No. PCT/JP2013/002417, filed on Apr. 9, 2013.

(30) Foreign Application Priority Data

Jun. 6, 2012 (JP) ................................ 2012-128577

(51) Int. Cl.
*H01L 31/0216* (2014.01)
*H01L 31/0224* (2006.01)
(Continued)

(52) U.S. Cl.
CPC ... *H01L 31/02167* (2013.01); *H01L 31/02366* (2013.01); *H01L 31/022425* (2013.01);
(Continued)

(58) Field of Classification Search
CPC .................. H01L 31/02167; H01L 31/022425; H01L 31/0392; H01L 31/03921
(Continued)

(56) References Cited

U.S. PATENT DOCUMENTS 5,668,050 A  9/1997  Iwasaki
6,140,570 A  10/2000  Kariya
(Continued)

FOREIGN PATENT DOCUMENTS

JP   8-18084    1/1996
JP   11-220154  8/1999
(Continued)

OTHER PUBLICATIONS

Notification of Transmittal of translation of the International Preliminary Report on Patentability (IPROP) issued Dec. 18, 2014 in International (PCT) Application No. PCT/JP2013/002417, together with IPROP and translation of Written Opinion.
(Continued)

*Primary Examiner* — Matthew Martin
*Assistant Examiner* — Tae-Sik Kang
(74) *Attorney, Agent, or Firm* — Wenderoth, Lind & Ponack, L.L.P.

(57) ABSTRACT

A solar cell element includes: a transparent body; a $Mg_xAg_{1-x}$ layer ($0.001 \le x \le 0.045$) having a thickness (2-13 nm); a ZnO layer having an arithmetical mean (Ra: 20-870 nm); and a transparent conductive layer. A photoelectric conversion layer including n-type and p-type layers further includes n-side and p-side electrodes. The ZnO layer is composed of ZnO columnar crystal grains grown on the $Mg_xAg_{1-x}$ layer, and each ZnO grain has a longitudinal direction along a normal line of the body, has a width increasing from the $Mg_xAg_{1-x}$ layer toward the transparent conductive layer, has a width which appears by cutting each ZnO grain along the normal line, and has a R2/R1 ratio (1.1-1.8). R1 represents the width of one end of the ZnO grain, and the one end is in contact with the surface of the $Mg_xAg_{1-x}$ layer, and R2 represents the width of the other end of the ZnO grain.

15 Claims, 12 Drawing Sheets

(51) Int. Cl.
*H01L 31/0236* (2006.01)
*H01L 31/0392* (2006.01)

(52) U.S. Cl.
CPC .. *H01L 31/022483* (2013.01); *H01L 31/0392* (2013.01); *H01L 31/03921* (2013.01); *Y02E 10/50* (2013.01)

(58) Field of Classification Search
USPC .......................................................... 136/256
See application file for complete search history.

(56) References Cited

U.S. PATENT DOCUMENTS

2011/0189814 A1  8/2011  Kawano et al.
2013/0118580 A1* 5/2013  Tawada ............. H01L 31/02248
                                                    136/256

FOREIGN PATENT DOCUMENTS

JP      2004-311704       11/2004
JP      2011-176283        9/2011
WO      WO2012/014572 A1 *  2/2012

OTHER PUBLICATIONS

International Search Report (ISR) issued May 21, 2013 in International (PCT) Application No. PCT/JP2013/002417.
Jenny Nelson, "The Physics of Solar Cells", World Scientific Pub. Co., The Physics of Solar Cells Downloaded from www.worldscientific.com by 125.53.27.116 on Nov. 27, 2013.

* cited by examiner $L$ = Evaluation Length

SOLAR CELL ELEMENT

CROSS-REFERENCE TO RELATED APPLICATIONS

This is a continuation application of International Application No. PCT/JP2013/002417, with an international filing date of Apr. 9, 2013, which claims priority of Japanese Patent Application No. 2012-128577 filed on Jun. 6, 2012, the contents of which is incorporated herein by reference.

BACKGROUND OF THE INVENTION (1) Field of the Invention

The present disclosure relates to a solar cell element.

(2) Description of Related Art

FIG. 14 shows a solar cell element disclosed in Patent Literature 1 (Japanese Patent laid-open Publication No. H11-220154 A). This solar cell element comprises a substrate 101, a reverse surface reflective layer 102, a first transparent electrode layer 103a formed of ZnO, a second transparent electrode layer 103b formed from ZnO, a semiconductor layer 105, an upper part transparent electrode 106, and a collective electrode in this order.

The second clear electrode layer 103b is composed of a plurality of columnar crystal grains. Each columnar crystal grain has a longitudinal direction along a normal line direction of the substrate 101. The second clear electrode layer 103b has a region where a plurality of columnar crystal grains radiate upwardly.

The upper transparent electrode 106 is irradiated with light from above to generate a voltage difference between the first clear electrode layer 103 and the upper transparent electrode 106.

SUMMARY

One non-limiting and exemplary embodiments provides a novel solar cell element having high photoelectric conversion efficiency.

In one general aspect, the techniques disclosed here feature: a method for generating an electric power using a solar cell element, the method includes:

(a) preparing the solar cell element 9 comprising:
a transparent substrate body 21;
a $Mg_xAg_{1-x}$ layer 22;
a ZnO layer 23;
a transparent conductive layer 3;
a photoelectric conversion layer 4 including an n-type semiconductor layer 41 and a p-type semiconductor layer 42;
an n-side electrode 6; and
a p-side electrode 7; wherein
the transparent substrate body 21, the $Mg_xAg_{1-x}$ layer 22, the ZnO layer 23, the transparent conductive layer 3, and the photoelectric conversion layer 4 are stacked in this order;
the n-side electrode 6 is electrically connected to the n-type semiconductor layer 41;
the p-side electrode 7 is electrically connected to the p-type semiconductor layer 42;
x represents a value of not less than 0.001 and not more than 0.045;
the $Mg_xAg_t$ layer 22 has a thickness of not less than 2 nanometers and not more than 13 nanometers;
the ZnO layer 23 has a arithmetical mean roughness of not less than 20 nanometers and not more than 870 nanometers;
the ZnO layer 23 is composed of a plurality of ZnO columnar crystal grains 23a grown on the surface of the $Mg_xAg_{1-x}$ layer 22;
each ZnO columnar crystal grain 23a has a longitudinal direction along a normal line direction of the transparent substrate body 21;
each ZnO columnar crystal grain 23a has a width which increases from the $Mg_xAg_{1-x}$ layer 22 toward the transparent conductive layer 3;
the width of each ZnO columnar crystal grain 23a appears by cutting each ZnO columnar crystal grain 23a along the normal line direction of the transparent substrate body 21; and
each ZnO columnar crystal grain 23a has a R2/R1 ratio of not less than 1.1 and not more than 1.8;
where R1 represents the width of one end of the ZnO columnar crystal grain 23a, the one end being in contact with the surface of the $Mg_xAg_{1-x}$ layer 22; and R2 represents the width of the other end of the ZnO columnar crystal grain 23a; and (b) irradiating the photoelectric conversion layer 4 with light through the transparent substrate body 21, the $Mg_xAg_{1-x}$ layer 22, the ZnO layer 23, and transparent conductive layer 3, so as to generate an electric power between the n-side electrode 6 and the p-side electrode 7.

The present disclosure provides a novel solar cell element having high photoelectric conversion efficiency.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

The present disclosure will become readily understood from the following description of non-limiting and exemplary embodiments thereof made with reference to the accompanying drawings, in which like parts are designated by like reference numerals and in which.

DETAILED DESCRIPTION

Figure 1:
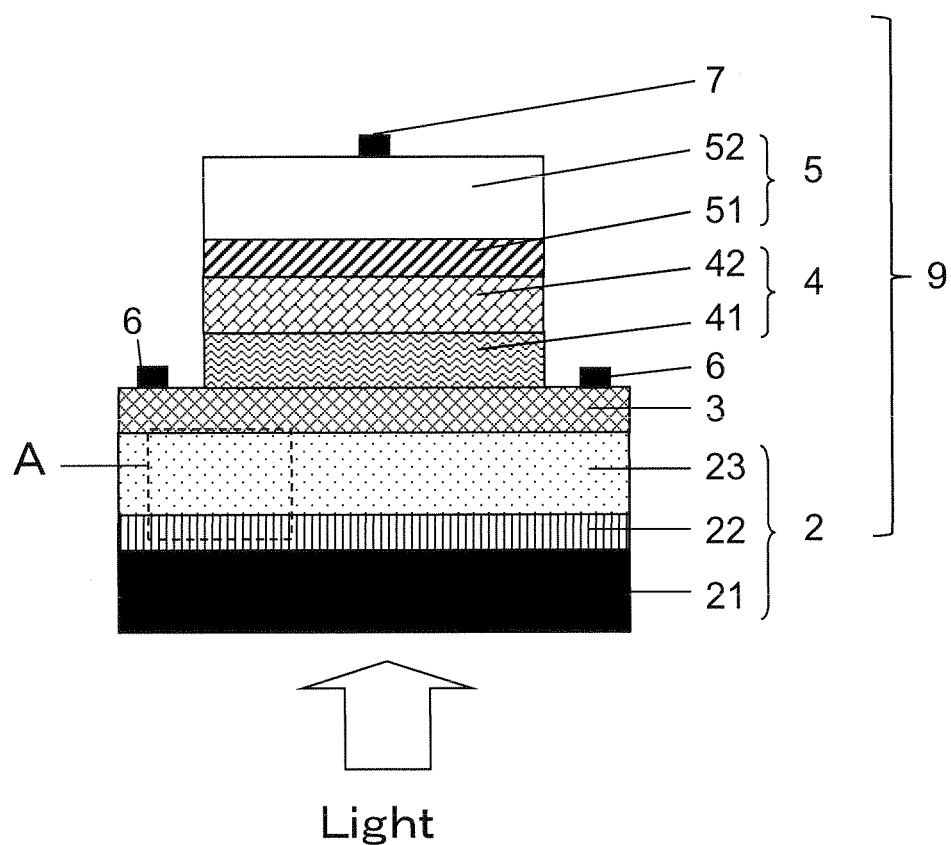
FIG. 1 shows a cross-sectional view of the solar cell element 9 according to the embodiment.

According to a first aspect, a method for generating electric power using a solar cell element, the method includes:

(a) preparing the solar cell element 9 including:
a transparent substrate body 21;
a $Mg_xAg_{1-x}$ layer 22;
a ZnO layer 23;
a transparent conductive layer 3;
a photoelectric conversion layer 4 including an n-type semiconductor layer 41 and a p-type semiconductor layer 42;
an n-side electrode 6; and
a p-side electrode 7; wherein
the transparent substrate body 21, the $Mg_xAg_{1-x}$ layer 22, the ZnO layer 23, the transparent conductive layer 3, and the photoelectric conversion layer 4 are stacked in this order;
the n-side electrode 6 is electrically connected to the n-type semiconductor layer 41;
the p-side electrode 7 is electrically connected to the p-type semiconductor layer 42;
x represents a value of not less than 0.001 and not more than 0.045;
the $Mg_xAg_{1-x}$ layer 22 has a thickness of not less than 2 nanometers and not more than 13 nanometers;
the ZnO layer 23 has a arithmetical mean roughness of not less than 20 nanometers and not more than 870 nanometers;
the ZnO layer 23 is composed of a plurality of ZnO columnar crystal grains 23a grown on the surface of the $Mg_xAg_{1-x}$ layer 22;
each ZnO columnar crystal grain 23a has a longitudinal direction along a normal line direction of the transparent substrate body 21;
each ZnO columnar crystal grain 23a has a width which increases from the $Mg_xAg_{1-x}$ layer 22 toward the transparent conductive layer 3;
the width of each ZnO columnar crystal grain 23a appears by cutting each ZnO columnar crystal grain 23a along the normal line direction of the transparent substrate body 21; and
each ZnO columnar crystal grain 23a has a R2/R1 ratio of not less than 1.1 and not more than 1.8;
where R1 represents the width of one end of the ZnO columnar crystal grain 23a, the one end being in contact with the surface of the $Mg_xAg_{1-x}$ layer 22; and R2 represents the width of the other end of the ZnO columnar crystal grain 23a; and (b) irradiating the photoelectric conversion layer 4 with light through the transparent substrate body 21, the $Mg_xAg_{1-x}$ layer 22, the ZnO layer 23, and transparent conductive layer 3, so as to generate electric power between the n-side electrode 6 and the p-side electrode 7.

Further, as a method of a second aspect, in the first aspect, further includes a reverse surface electrode layer 5; and
the photoelectric conversion layer 4 is interposed between the n-type semiconductor layer and the reverse surface electrode layer 5.

Further, as a method of a third aspect, in the second aspect, wherein the n-type semiconductor layer 41 is interposed between the transparent conductive layer 3 and the p-type semiconductor layer 42; and
the p-type semiconductor layer 42 is interposed between the n-type semiconductor layer 41 and the reverse surface electrode layer 5.

Further, as a method of a fourth aspect, in the third aspect, wherein the n-side electrode 6 is formed on the transparent conductive layer 3; and
the p-side electrode 7 is formed on the reverse surface electrode layer 5.

Further, as a method of a fifth aspect, in the first aspect, wherein the ZnO layer 23 has a volume resistivity of not less than $1\times10^{-3}$ Ω·cm.

Further, as a method of a sixth aspect, in the first aspect, wherein the transparent conductive layer 3 has a volume resistivity of less than $1\times10^{-3}$ Ω·cm.

Further, as a method of a seventh aspect, in the first aspect, wherein the ZnO layer 23 has a volume resistivity of not less than $1\times10^{-3}$ Ω·cm,
the transparent conductive layer 3 is formed of ZnO having a volume resistivity of less than $1\times10^{-3}$ Ω·cm.

Further, as a method of a seventh aspect, in the first aspect, wherein the light is sunlight.

According to a ninth aspect, a solar cell element 9 including:
a transparent substrate body 21;
a MgxAg1-x layer 22;
a ZnO layer 23;
a transparent conductive layer 3;
a photoelectric conversion layer 4 including an n-type semiconductor layer 41 and a p-type semiconductor layer 42;
an n-side electrode 6; and
a p-side electrode 7;
wherein the transparent substrate body 21, the MgxAg1-x layer 22, the ZnO layer 23, the transparent conductive layer 3, and the photoelectric conversion layer 4 are stacked in this order;
the n-side electrode 6 is electrically connected to the n-type semiconductor layer 41;
the p-side electrode 7 is electrically connected to the p-type semiconductor layer 42;
x represents a value of not less than 0.001 and not more than 0.045;
the MgxAg1-x layer 22 has a thickness of not less than 2 nanometers and not more than 13 nanometers;
the ZnO layer 23 has a arithmetical mean roughness of not less than 20 nanometers and not more than 870 nanometers;
the ZnO layer 23 is composed of a plurality of ZnO columnar crystal grains 23a grown on the surface of the MgxAg1-x layer 22;

each ZnO columnar crystal grain 23a has a longitudinal direction along a normal line direction of the transparent substrate body 21;

each ZnO columnar crystal grain 23a has a width which increases from the MgxAg1-x layer 22 toward the transparent conductive layer 3;

the width of each ZnO columnar crystal grain 23a appears by cutting each ZnO columnar crystal grain 23a along the normal line direction of the transparent substrate body 21; and each ZnO columnar crystal grain 23a has a R2/R1 ratio of not less than 1.1 and not more than 1.8;

where R1 represents the width of one end of the ZnO columnar crystal grain 23a, the one end being in contact with the surface of the MgxAg1-x layer 22; and R2 represents the width of the other end of the ZnO columnar crystal grain 23a.

Further, as a solar cell element of a tenth aspect, in the ninth aspect, further includes a reverse surface electrode layer 5; and the photoelectric conversion layer 4 is interposed between the n-type semiconductor layer and the reverse surface electrode layer 5.

Further, as a solar cell element of an eleventh aspect, in the tenth aspect, wherein the n-type semiconductor layer 41 is interposed between the transparent conductive layer 3 and the p-type semiconductor layer 42; and the p-type semiconductor layer 42 is interposed between the n-type semiconductor layer 41 and the reverse surface electrode layer 5.

Further, as a solar cell element of a twelfth aspect, in the ninth aspect, wherein the n-side electrode 6 is formed on the transparent conductive layer 3; and the p-side electrode 7 is formed on the reverse surface electrode layer 5.

Further, as a solar cell element of a thirteenth aspect, in the ninth aspect, wherein the ZnO layer 23 has a volume resistivity of not less than $1 \times 10^{-3}$ Ω·cm.

Further, as a solar cell element of a fourteenth aspect, in the ninth aspect, wherein the transparent conductive layer 3 has a volume resistivity of less than $1 \times 10^{-3}$ Ω·cm.

Further, as a solar cell element of a fifteenth aspect, in the ninth aspect, wherein the ZnO layer 23 has a volume resistivity of not less than $1 \times 10^{-3}$ Ω·cm, the transparent conductive layer 3 is formed of ZnO having a volume resistivity of less than $1 \times 10^{-3}$ Ω·cm.

The embodiment of the present disclosure is described with reference to the drawings.

(Embodiment)

(Step (a))

In the step (a), a solar cell element 9 is prepared.

FIG. 1 shows a cross-sectional view of the solar cell element 9 according to the embodiment.

The solar cell element 9 comprises a transparent substrate 2, a transparent conductive layer 3, a photoelectric conversion layer 4, a reverse surface electrode layer 5, an n-side electrode 6, and a p-side electrode 7 in this order.

The transparent substrate 2 includes a transparent substrate body 21, MgxAg1-x layer 22, and a ZnO layer 23. The MgxAg1-x layer 22 is interposed between the transparent substrate body 21 and the ZnO layer 23.

(Transparent Substrate Body 21)

It is desirable that the transparent substrate body 21 is permeable to light (e.g., sunlight) having a wavelength of not less than 300 nanometers and not more than 1,100 nanometers. An example of the transparent substrate body 21 is a glass substrate, a ceramics substrate, a plastic substrate, or a metal substrate. In view of the intensity and the heat resistance, a glass substrate having a thickness of 0.3 millimeters-7 millimeters is desirable.

(MgxAg1-x Layer 22)

The MgxAg1-x layer 22 consists of alloy of sodium and silver. The character of "x" represents a value of not less than 0.001 and not more than 0.045. When the value of x is less than 0.001, photoelectric conversion efficiency is decreased. See the comparative example 3. Similarly, when the value of x is more than 0.045, the photoelectric conversion efficiency is decreased. See the comparative example 4.

When the MgxAg1-x layer 22 is not provided, the photoelectric conversion efficiency is decreased. See the comparative example 5.

The MgxAg1-x layer 22 has a thickness of not less than 2 nanometers and not more than 13 nanometers. Since the MgxAg1-x layer 22 is significantly thin, the MgxAg1-x layer 22 is permeable to light. When the MgxAg1-x layer 22 is not provided, the photoelectric conversion efficiency is decreased. When the MgxAg1-x layer 22 has a thickness of more than 13 nanometers, the photoelectric conversion efficiency is decreased.

The MgxAg1-x layer 22 may be formed by a sputtering method.

(ZnO Layer 23)

The ZnO layer 23 is an arithmetical mean deviation of the profile (hereinafter, referred to as "Ra") of not less than 20 nanometers and not more than 870 nanometers.

The arithmetical mean deviation of the profile Ra is the arithmetic mean of the absolute values of distances from the mean line to the surface roughness profile.

The value of Ra is represented by the following formula (I):

$$Ra=(1/L) \cdot \int_0^L |f(x)| dx \qquad (I)$$

where, L: Evaluation length, and f (x): Surface roughness profile.

Figure 15:
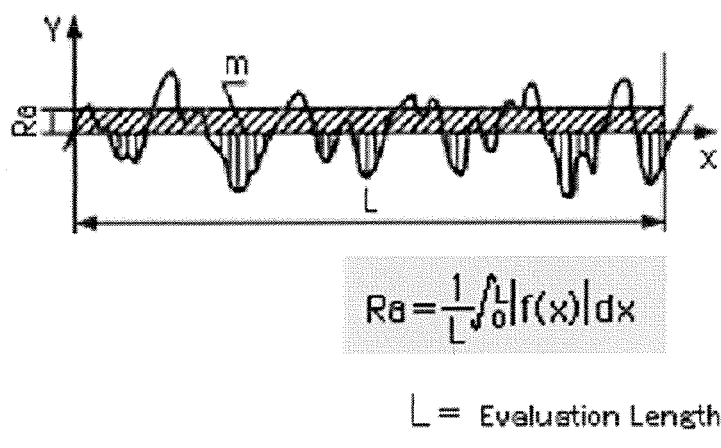
FIG. 15 shows a drawing for explaining Ra.

FIG. 15 shows a drawing for explaining Ra.

The value of Ra may be measured with a surface roughness measuring apparatus. The surface roughness measuring apparatus is available from Taylor Hobson company, as trade name "CCI Lite".

Figure 12:
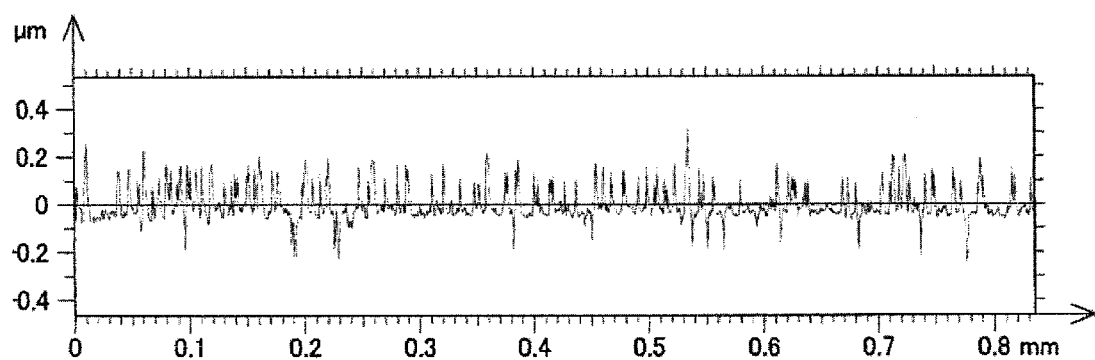
FIG. 12 shows one example of a surface roughness profile.

The surface roughness profile is a profile obtained by measuring the projection-and-recess shape of the surface of the object using a surface roughness measuring apparatus. FIG. 12 shows an example of the surface roughness profile.

For more detail of the arithmetical mean roughness, see the following home page: http://www.ns-tool.com/technology/technology_06.html.

When the value of Ra is less than 20 nanometers, the photoelectric conversion efficiency is decreased. See the comparative example 1. When the value of Ra is more than 870 nanometers, the photoelectric conversion efficiency is decreased. See the comparative example 2.

ZnO transparent. Therefore, the ZnO layer 23 is permeable to light.

Figure 16:
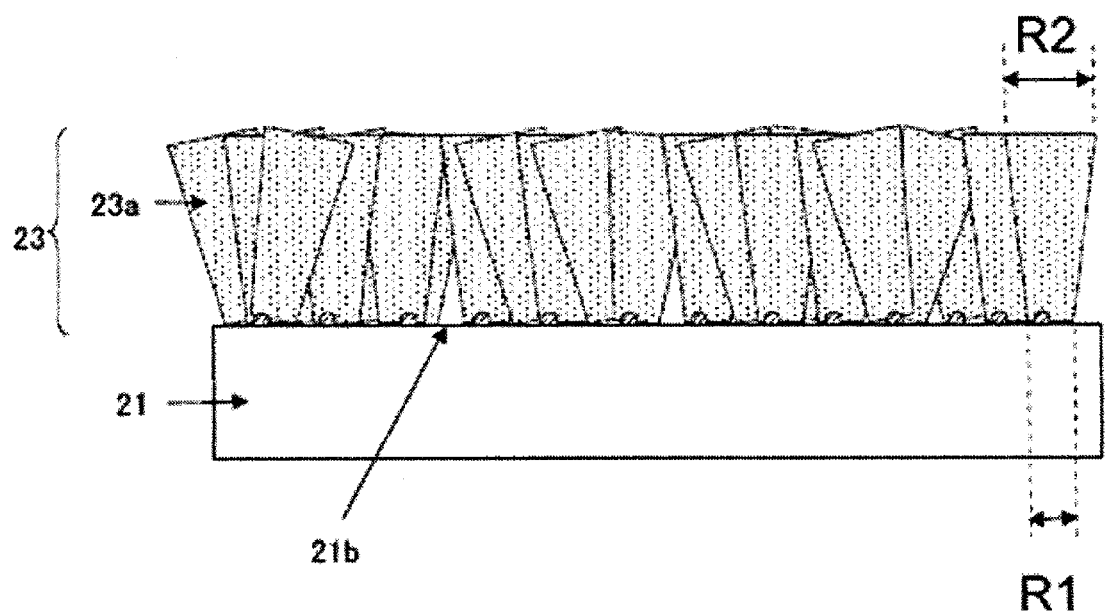
FIG. 16 shows an enlarged view of the part surrounded by a dash line A depicted in FIG. 1.

As shown in FIG. 16, the ZnO layer 23 is composed of a plurality of ZnO columnar crystal grains 23a. Each ZnO columnar crystal grain 23a is grown, using Ag contained in the MgxAg1-x layer 22 as a core. Mg contained in the MgxAg1-x layer 22 improves the crystallinity of the ZnO columnar crystal grain 23a.

Each ZnO columnar crystal grain 23a has a longitudinal direction along a normal line direction of the transparent substrate body 21.

Each ZnO columnar crystal grain 23a has a width which increases from the MgxAg1-x layer 22 toward the transparent electrode layer 3. More particularly, Each ZnO columnar crystal grain 23a has a R2/R1 ratio of not less than 1.1 and not more than 1.8. As shown in FIG. 16, the value of R1 represents a width of an end of the ZnO columnar crystal grain 23a which is in contact with the MgxAg1-x layer 22 which is in contact with the ZnO layer 3. The value of R2 represents a width of the other end of the ZnO columnar crystal grain 23a. When the R2/R1 ratio is less than 1.1, the photoelectric conversion efficiency is decreased. See the comparative example 1. When the R2/R1 is more than 1.8, the photoelectric conversion efficiency is decreased. See the comparative example 2.

The width of the ZnO columnar crystal grain 23a appears by cutting the ZnO columnar crystal grain 23a along a normal line direction of the transparent substrate body 21. This width is substantially perpendicular to the longitudinal direction of the ZnO columnar crystal grain 23a.

The ZnO layer 23 has a volume resistivity of more than $1 \times 10^{-3}$ Ω·cm.

(Transparent Conductive Layer 3)

The transparent conductive layer 3 is interposed between the ZnO layer 23 and the photoelectric conversion layer 4. An example of the material of the transparent conductive layer 3 is zinc oxide doped with at least one selected from the group consisting of gallium, aluminum and boron. The transparent conductive layer 3 has a volume resistivity of less than $1 \times 10^{-3}$ Ω·cm. Since the ZnO layer 23 has a great volume resistivity, it is difficult to obtain an electric power from the ZnO layer 23 efficiently. Therefore, it is desirable to provide such a low-resistance transparent conductive layer 3.

(Photoelectric Conversion Layer 4)

The photoelectric conversion layer 4 includes an n-type semiconductor layer 41 and a p-type semiconductor layer 42. An example of the material of the n-type semiconductor layer 41 is silicon or GaAs. An example of the material of the p-type semiconductor layer 42 is also silicon or GaAs.

In FIG. 1, the n-type semiconductor layer 41 and the p-type semiconductor layer 42 are formed in this order on the transparent conductive layer 3. The n-type semiconductor layer 41 is in contact with the p-type semiconductor layer 42 to form a pn-junction.

(Reverse Surface Electrode Layer 5)

The solar cell element 9 may comprise the reverse surface electrode layer 5. The reverse surface electrode layer 5 may include a buffer layer 51 and a reflective layer 52.

The buffer layer 51 is interposed between the photoelectric conversion layer 42 and the reflective layer 52. An example of the material of the buffer layer 51 is (a) transparent conductive material such as zinc oxide, indium oxide, tin oxide, or cadmium oxide, or (b) transparent semiconductor material such as iron oxide, titanium oxide, zinc selenide, or zinc sulphide. Zinc oxide is desirable.

An example of the material of the reflective layer 52 is gold, silver, copper, aluminum, platinum, or alloy thereof. Silver is desirable.

(n-Side Electrode 6)

The n-side electrode 6 is electrically connected to the n-type semiconductor layer 41. In FIG. 1, the n-side electrode 6 forms an ohmic contact together with the transparent conductive layer 3. An example of a suitable material of the n-side electrode 6 is silver, gold, copper, aluminum, platinum, or alloy thereof. Platinum is desirable.

(p-Side Electrode 7)

The p-side electrode 7 is electrically connected to the p-type semiconductor layer 42. In FIG. 1, the p-side electrode 7 forms an ohmic contact together with the reflective layer 52. An example of a suitable material of the p-side electrode 7 is silver, gold, copper, aluminum, platinum, or alloy thereof. Platinum is desirable.

Then, a method for fabricating the solar battery element according to the embodiment is described with reference to FIG. 2-FIG. 11.

Figure 2:
FIG. 2 shows a cross-sectional view of one step included in a method for fabricating the solar cell element 9.

First, as shown in FIG. 2, the transparent substrate body 21 is prepared. A glass substrate is desirable. The MgxAg1-x layer 22 is formed on the surface of transparent substrate body 21 by a conventional semiconductor growth method such as a RF magnetron sputtering method or a vacuum evaporation method.

Then, the MgxAg1-x layer 22 is heated. An example of a heating method is an anneal method, a vacuum heating method, a UV-ozone method, an advanced oxidation process method, an anneal method under oxygen atmosphere, or an anode oxidation method. An anneal method under a temperature of 50-800 degrees Celsius is desirable. The width of the MgxAg1-x layer 22 is decreased by the heat treatment. In other words, the area of the MgxAg1-x layer 22 is decreased. In this way, island-shaped MgxAg1-x areas 22 are formed on the transparent substrate body 21.

Accordingly, the MgxAg1-x layer 22 may not cover the whole surface of the transparent substrate body 21. In this case, as shown in FIG. 16, a portion 21b of the transparent substrate body 21 which is not covered may be exposed. FIG. 16 shows an enlarged view of the part surrounded by the dashed line A depicted in FIG. 1. As shown in FIG. 16, the ZnO layer 23 is composed of the plurality of the ZnO columnar crystal grains 23a. Since each ZnO columnar crystal grain 23a has the R2/R1 ratio of not less than 1.1 and not more than 1.8, the upper surface of the ZnO layer 23 does not have an interspace. On the contrary, the portion 21b of the transparent substrate body 21 which is covered neither by the MgxAg1-x layer 22 nor by the ZnO layer 23 may be exposed.

The surface roughness of the MgxAg1-x layer 22 may be varied by the temperature of the heat treatment.

Instead of the above-mentioned formation method of the MgxAg1-x layer 22, the MgxAg1-x layer 22 may be formed by the following method.

Figure 3:
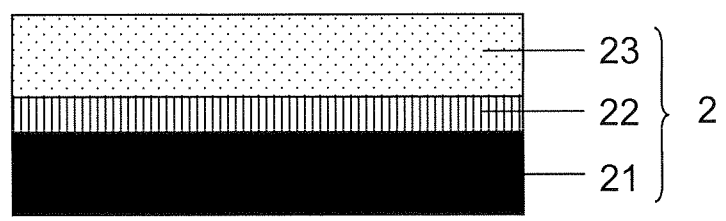
FIG. 3 shows a cross-sectional view of one step included in a method for fabricating the solar cell element 9, subsequently to FIG. 2.

First, a glass substrate containing sodium is prepared as the transparent substrate body 21. More particularly, a soda-lime glass substrate is prepared. A silver layer is formed on the surface of this transparent substrate body 21. Subsequently, the transparent substrate body 21 is heated to diffuse the sodium into the silver layer. In this way, the MgxAg1-x layer 22 may be formed. An example of the heating method is an anneal method or technique or a vacuum-heating method. A vacuum-heating method under a temperature of 200-600 degrees Celsius is desirable:

As shown in FIG. 3, the ZnO layer 23 is formed on the MgxAg1-x layer 22 by a CBD method using a mixture of Zn (NO3) 2 and hexamethylene tetramine (hereinafter, referred to as "HMT") under a temperature of 20-90 degrees Celsius.

The surface projection-and-recess roughness of the formed ZnO layer 23 become larger with increase of the time of the processing time of the reactive ion etching or the chemical etching. In the reactive ion etching, CH4 gas may be used. In the chemical etching, chloride solution may be used. The ZnO layer 23 is in contact with the MgxAg1-x layer 22. To be more exact, the ZnO layer 23 is in contact with the top surface of the MgxAg1-x layer 22.

Figure 4:
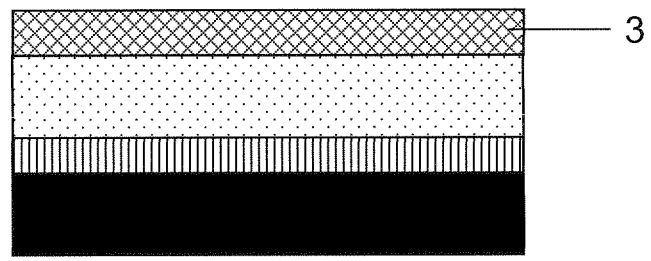
FIG. 4 shows a cross-sectional view of one step included in a method for fabricating the solar cell element 9, subsequently to FIG. 3.

As shown in FIG. 4, the transparent conductive layer 3 is formed on the ZnO layer 23 uniformly. An example of the method for forming the transparent conductive layer 3 is a pulse laser deposition method (hereinafter, referred to as "PLD method").

Figure 5:
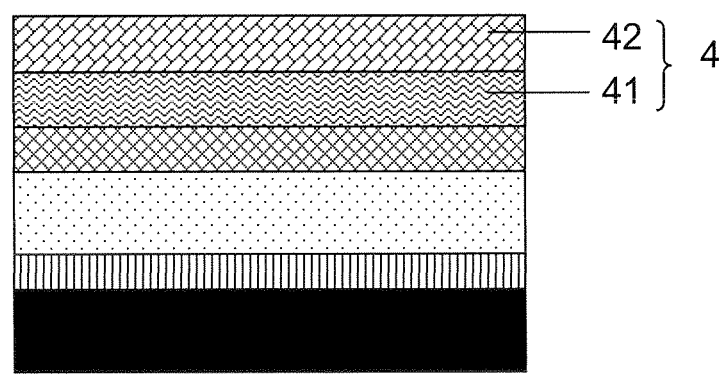
FIG. 5 shows a cross-sectional view of one step included in a method for fabricating the solar cell element 9, subsequently to FIG. 4.

As shown in FIG. 5, the n-type silicon layer 41 and the p-type silicon layer 42 are deposited on the transparent electrically conducting layer 3 by a plasma CVD method to form the photoelectric conversion layer 4.

The n-type silicon layer 41 may be formed by a plasma CVD method using a gaseous mixture containing phosphine, silane, and hydrogen. The p-type silicon layer 41 is deposited by a plasma CVD method using a gaseous mixture containing diborane, silane, methane, and hydrogen.

Figure 6:
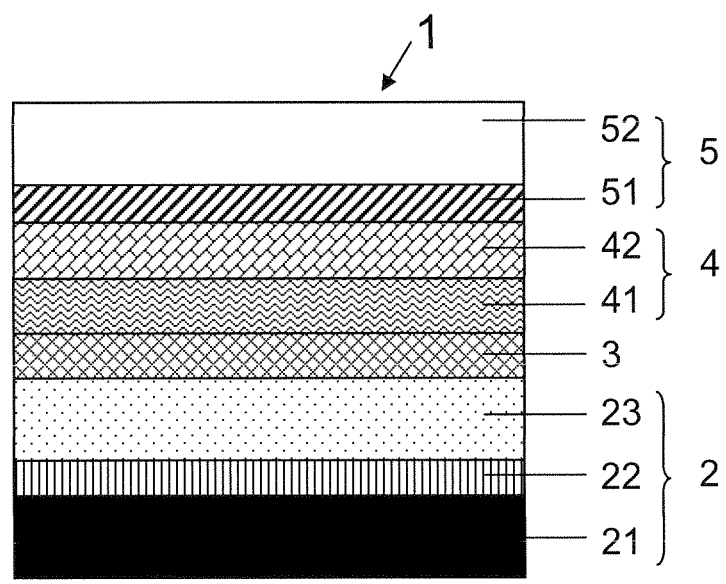
FIG. 6 shows a cross-sectional view of one step included in a method for fabricating the solar cell element 9, subsequently to FIG. 5.

As shown in FIG. 6, the reverse surface electrode layer 5 including a buffer layer 51 and a reflective layer 52 is formed.

An example of a method for forming the buffer layer 51 is a PLD method, a RF magnetron sputtering method, or a vacuum evaporation method.

An example of a method for forming the reflective layer 52 is a RF magnetron sputtering method or a vacuum evaporation method.

In this way, a laminate 1 shown in FIG. 6 is obtained.

Figure 7:
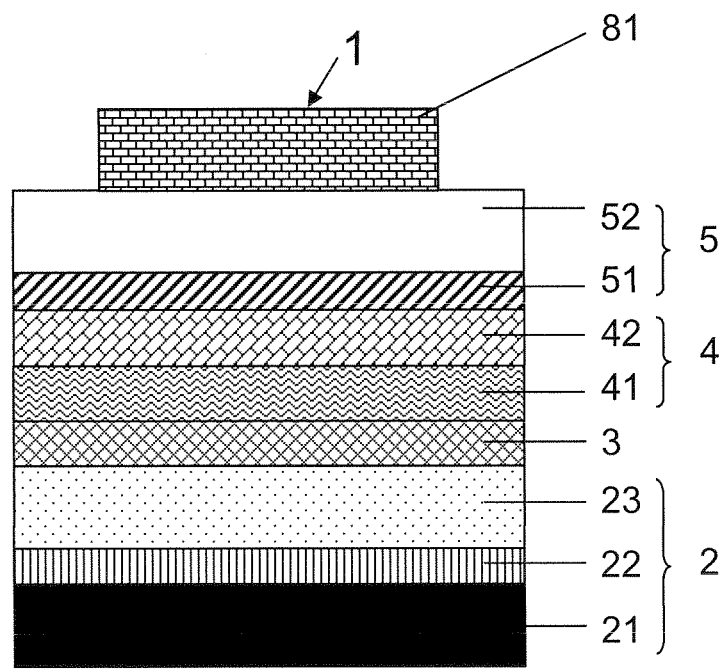
FIG. 7 shows a cross-sectional view of one step included in a method for fabricating the solar cell element 9, subsequently to FIG. 6.

Then, as shown in FIG. 7, a first mask 81 is formed on the surface of the laminate 1 by photolithography.

Figure 8:
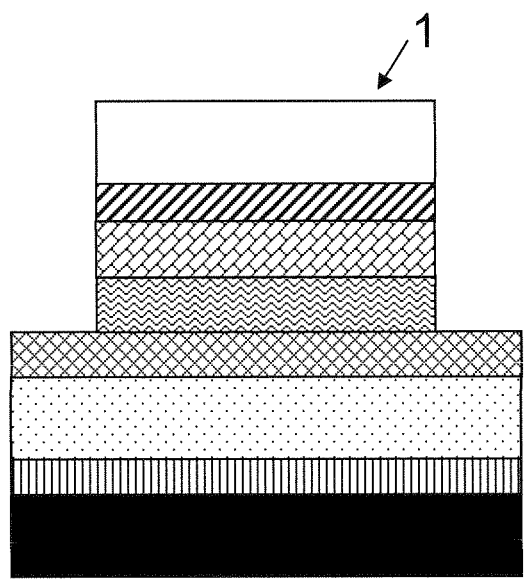
FIG. 8 shows a cross-sectional view of one step included in a method for fabricating the solar cell element 9, subsequently to FIG. 7.

As shown in FIG. 8, an unnecessary portion of the laminate 1 is removed by etching. More particularly, an unnecessary portion of the reflective layer 52 and an unnecessary portion of the buffer layer 51 are removed by wet-etching using with a mixture of hydrochloric acid and nitric acid. Furthermore, an unnecessary portion of the photoelectric conversion layer 4 is removed by ICP plasma etching using a gaseous mixture of oxygen, Ar, and mixed gas of SF6, using this resist film as the first mask 81.

Finally, the first mask 81 is removed.

Figure 9:
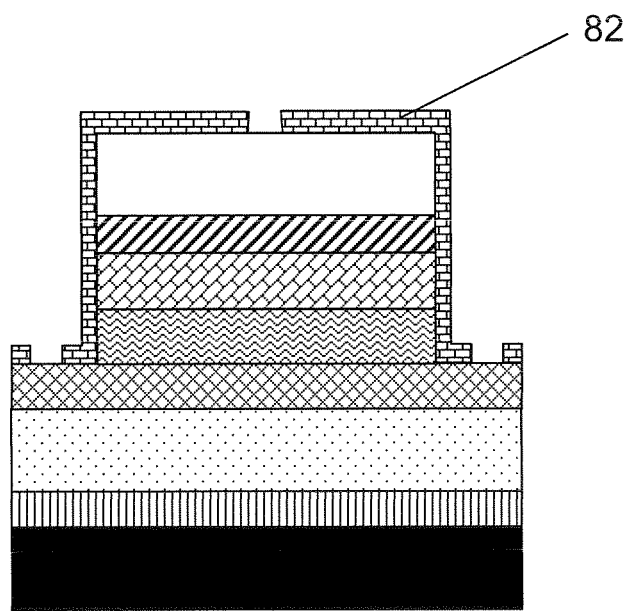
FIG. 9 shows a cross-sectional view of one step included in a method for fabricating the solar cell element 9, subsequently to FIG. 8.

As shown in FIG. 9, a second mask 82 is formed by photolithography. This second mask 82 has a first opening 821 and d second opening 822. The transparent conductive layer 3 is located under the first opening 821. The reflective layer 52 is located under the second opening 822.

Figure 10:
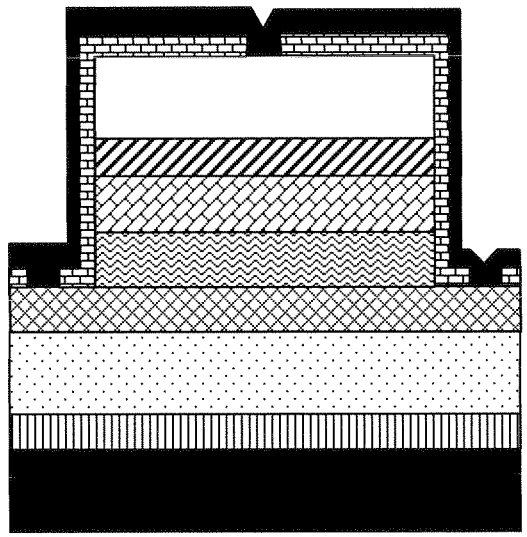
FIG. 10 shows a cross-sectional view of one step included in a method for fabricating the solar cell element 9, subsequently to FIG. 9.
Figure 11:
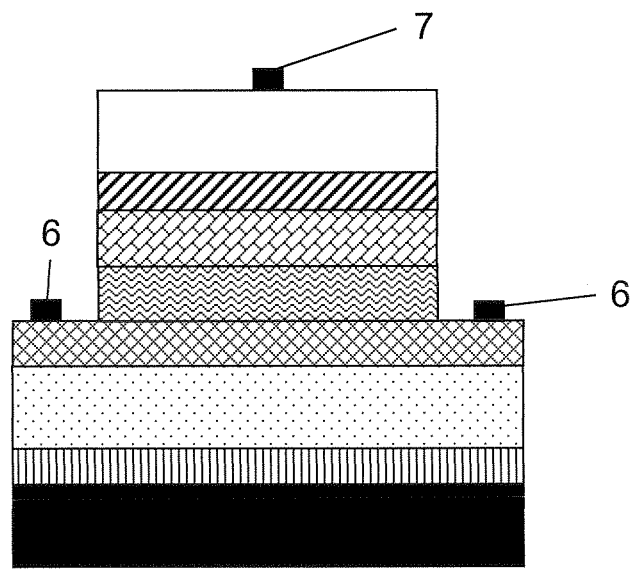
FIG. 11 shows a cross-sectional view of one step included in a method for fabricating the solar cell element 9, subsequently to FIG. 10.

As shown in FIG. 10, a metal layer is formed on the second mask 82 by a sputter vacuum deposition method or an electron beam evaporation method. Finally, the second mask 82 is removed, as shown in FIG. 11. In this way, the n-side electrode 6 and the p-side electrode 7 are formed.

(Step (b))

In the step (b), as shown in FIG. 1, the transparent substrate body 21 is irradiated with light. The light penetrates the transparent substrate body 21, the MgxAg1-x layer 22, the ZnO layer 23, and the transparent conductive layer 3 to reach the photoelectric conversion layer 4. The light is converted into electricity by the photoelectric conversion layer 4. In this way, an electric power is generated between the n-side electrode 6 and the p-side electrode 7.

EXAMPLES

The following examples describe the present disclosure in more detail.

Example 1

In the example 1, the solar cell element 9 shown in FIG. 1 was fabricated in accordance with the method shown in FIG. 2-FIG. 11.

First, a glass substrate having a thickness of 5 millimeters was prepared as the transparent substrate body 21. The transparent substrate body 21 had a length of 25 millimeters and a width of 25 millimeters. The transparent substrate body 21 had a light transmittance of 88-90%. The transparent substrate body 21 was immersed in ethanol and washed under an ultrasonic application.

Then, the $Mg_xAg_{1-x}$ layer 22 (x=0.001) was formed on the transparent substrate body 21 by a RF magnetron sputtering method. In the RF magnetron sputtering method, used was a mixture target of Mg and Ag having a molar ratio of 1:999. The formed $Mg_xAg_{1-x}$ layer 22 had a thickness of 2 nanometers.

The transparent substrate body 21 thus provided was heated under a temperature of 400 degrees Celsius for ten minutes.

Then, as shown in FIG. 3, the transparent substrate body 21 was immersed in a liquid mixture of Zn $(NO_3)_2$ and HMT warmed at 70 degrees Celsius for three hours so as to form the ZnO layer 23. The Zn $(NO_3)_2$ had a concentration of 0.1M. The HMT also had a concentration of 0.1M. The formed ZnO layer 23 had a thickness of 1 micrometer.

The Ra of the formed ZnO layer 23 was measured with a surface roughness measuring apparatus (available from Taylor Hobson company, trade name "CCI Lite"). As a result, the value of Ra was 20 nanometers.

Figure 17:
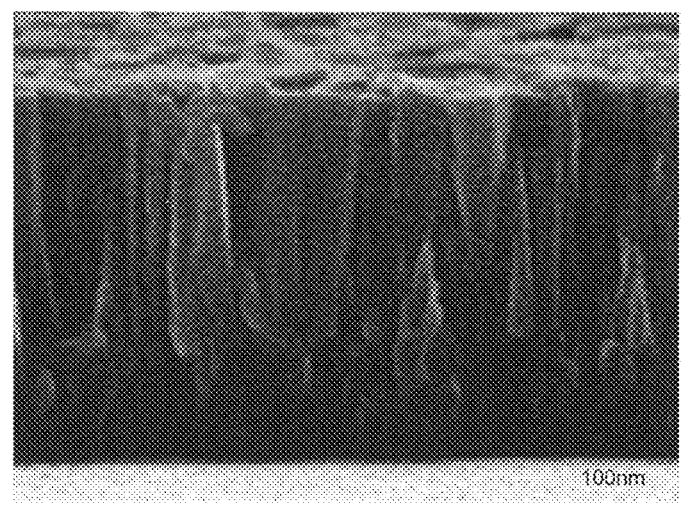
FIG. 17 shows an SEM image of the $Mg_xAg_{1-x}$ layer 22 according to the example 1.

Then, the values of R1 and R2 of the ZnO columnar crystal grain 23a contained in the ZnO layer 23 were measured. More particularly, the laminate 1 was cut along a normal line direction of the transparent substrate body 21. FIG. 17 shows a SEM image of the ZnO layer 23 included in the laminate 1 which was thus cut. On the basis of the SEM image, the values of R1 and R2 were measured.

As a result, the value of R1 was 121 nanometers. The value of R2 was 169 nanometers. Therefore, the R2/R1 ratio was approximately 1.4.

A volume resistivity was calculated on the basis of on the following formula:

$$\text{Volume resistivity} = RE \cdot t \cdot RCF$$

Here, the value of RE represents a resistance value measured according to a four-terminal measurement method. A measurement apparatus for measuring a resistance value measured according to the four-terminal measurement method is available from Mitsubishi Chemical Corporation, as a trade name: Loresta-Gp MCP-T610.

The value of t represents a thickness of the ZnO layer 23.

The value of RCF represents a resistivity correction factor. In this example, the value of RCF was 4.398.

As a result, the ZnO layer 23 had a volume resistivity of $9.86 \times 10^{-3}$ Ω·cm.

Then, as shown in FIG. 4, the transparent conductive layer 3 was formed on the ZnO layer 23 by a PLD method. The material of the transparent conductive layer 3 was zinc oxide where 5.7 weight % of gallium was doped. Hereinafter, zinc oxide doped with gallium is referred to as "GZO". The transparent conductive layer 3 had a thickness of 100 nanometers. The volume resistivity of the transparent conductive layer 3 was measured similarly to that of the ZnO layer 23. As a result, the transparent conductive layer 3 had a volume resistivity of $5.1 \times 10^{-4}$ Ω·cm.

As shown in FIG. 5, the n-type semiconductor layer 41 consisting of n-type silicon and the p-type semiconductor layer 42 consisting of p-type silicon were formed in this order by a plasma CVD method so as to form the photoelectric conversion layer 4. The n-type semiconductor layer 41 had a thickness of 40 nanometers. The p-type semiconductor layer 42 had a thickness of 11 nanometers.

As shown in FIG. 6, a GZO film having thickness of 40 nanometers was formed on the p-type semiconductor layer 42 by a sputter vacuum deposition method. In this way, the buffer layer 51 consisting of the GZO film was formed.

Furthermore, a silver layer having a thickness of 200 nanometers was formed on the buffer layer 51 by a sputter vacuum deposition. In this way, the reflective layer 52 consisting of silver was formed.

As shown in FIG. 7, the resist film 81 of 20 millimeters square was formed on the reflective layer 52 by photolithography. Using this resist film as the first mask 81, an unnecessary portion of the reflective layer 52 and an unnecessary portion of the buffer layer 51 were removed by wet-etching using liquid mixture of hydrochloric acid and nitric acid. Furthermore, using this resist film as the first mask 81, an unnecessary portion of the photoelectric conversion layer 4 was removed by an ICP plasma etching using a gaseous mixture of oxygen, argon, and SF6.

Subsequently, as shown in FIG. 8, the first mask 81 was removed.

As shown in FIG. 9, the second mask 82 was formed by photolithography. The second mask 82 had a first opening 821 and a second opening 822. The first opening 821 was formed on the transparent conductive layer 3. The first opening 821 had a size of 22 millimeters square. The second opening 822 was formed on the reflective layer 52. The second opening 822 had a size of 2 millimeters x 22 millimeters.

As shown in FIG. 10, a platinum film having a thickness of 100 nanometers was formed so that the second mask was covered with the platinum film.

Finally, as shown in FIG. 11, the resist film 82 was removed to form the n-side electrode 6 consisting of platinum and the p-side electrode 7 consisting of platinum. In this way, the solar cell element 9 was provided.

During the measurement of the photoelectric conversion efficiency, the transparent substrate body 21 was irradiated with pseudo-sunlight, which is described later.

The photoelectric conversion efficiency of the solar cell element 9 was calculated as below.

The transparent substrate body 21 was irradiated with the pseudo-sunlight having power energy of 100 mW/cm$^2$.

The pseudo-sunlight was radiated from the lamp where a xenon lamp (available from Wacom Co., Ltd.) of 500 watts and a halogen lamp (available from Wacom Co., Ltd.) of 400 watts were combined together.

The open circuit voltage $V_{oc}$ was measured when the n-side electrode 6 and the p-side electrode 7 were electrically opened.

The short-circuit current $I_{sc}$ was measured when the n-side electrode 6 and the p-side electrode 7 were short-circuited.

Figure 13:
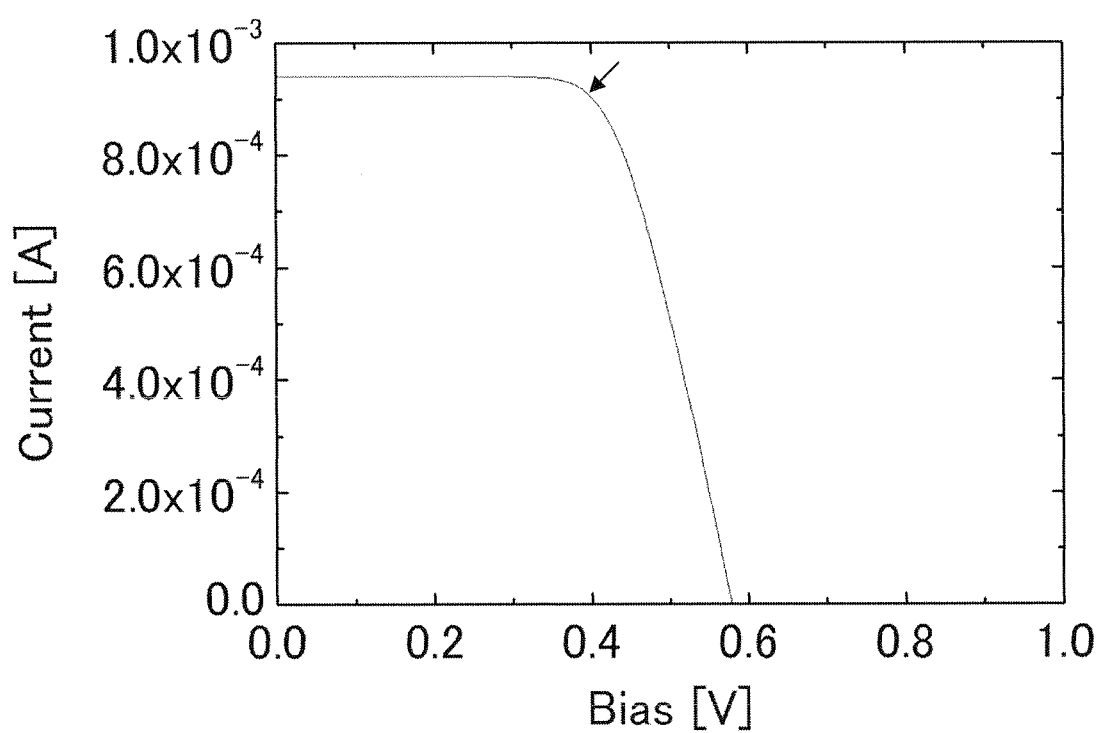
FIG. 13 shows an I-V-curve obtained in the example 1.
Figure 14:
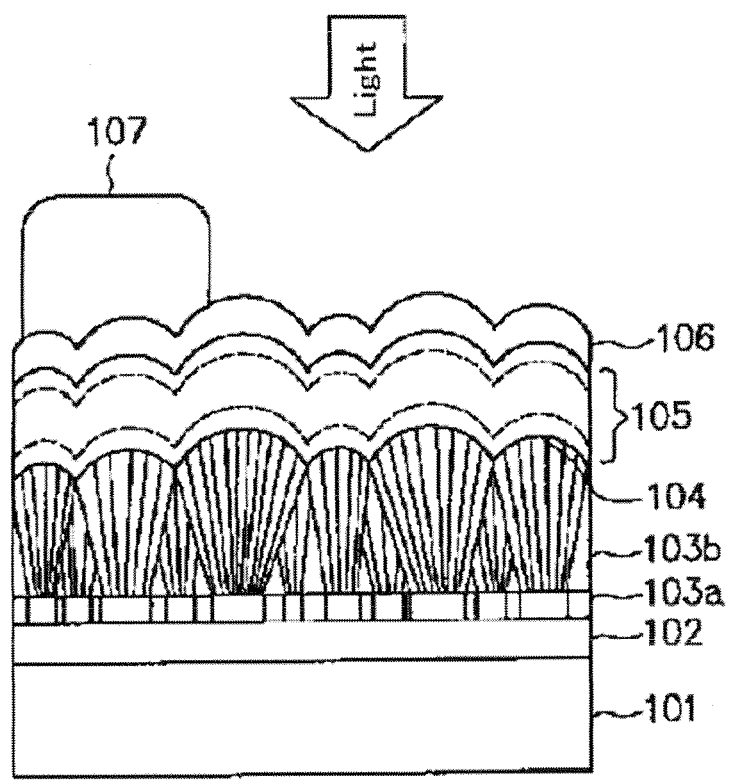
FIG. 14 shows a solar cell element disclosed in Patent Literature 1.

An I-V curve line as shown in FIG. 13 was obtained using a solar simulator (available from Wacom Co., Ltd., Trade name: Super Solar simulator WXS-90S-L2).

On the basis of FIG. 13, the fill factor (hereinafter, referred to as "FF") was obtained in accordance with the disclosure of Non Patent Literature 1 (Jenny Nelson (2003), The physics of Solar Cells, Imperial college press, pp. 11-13).

The fill factor FF was calculated in accordance with the following math formula.

$$FF = \frac{V_{max} \cdot I_{max}}{V_{OC} \cdot I_{SC}}$$

Here, $V_{max}$ means the voltage when the V·I value of the I-V curve is maximum in FIG. 13 (See the arrow in FIG. 13).

$I_{max}$ means the electric current when the V·I value of the I-V curve is maximum in FIG. 13 (See the arrow in FIG. 13).

The photoelectric conversion efficiency is calculated in accordance with the following formula.

Photoelectric conversion efficiency=$V_{oc} \cdot J_{sc} \cdot FF$

Here, $J_{sc}=I_{sc}/S$

S (effective light-receiving surface area)=400 square micrometers

The results are shown in Table 1.

Example 2

The experiment similar to the example 1 was conducted, except that the $Mg_{0.001}Ag_{0.999}$ layer had a thickness of 13.0 nanometers. The results are shown in Table 1.

Example 3

The experiment similar to the example 1 was conducted, except that the ZnO layer 23 was formed with liquid mixture of 0.05M $Zn(NO_3)_2$ and 0.05M HMT. The results are shown in Table 1.

Example 4

The experiment similar to the example 1 was conducted, except that the ZnO layer 23 was formed with liquid mixture of 0.75M $Zn(NO_3)_2$ and 0.75M HMT. The results are shown in Table 1.

Example 5

The experiment similar to the example 1 was conducted, except that x=0.045.

The results are shown in Table 1.

Comparative Example 1

The experiment similar to the example 1 was conducted, except that the ZnO layer 23 was formed with liquid mixture of 0.01M Zn (NO3) 2 and 0.01M HMT. The results are shown in Table 2.

Comparative Example 2

The experiment similar to the example 1 was conducted, except that the ZnO layer 23 was formed with liquid mixture of 1M Zn (NO3) 2 and 1M HMT. The results are shown in Table 2.

Comparative Example 3

The experiment similar to the example 1 was conducted, except that x=0.0005.

The results are shown in Table 2.

Comparative Example 4

The experiment similar to the example 1 was conducted, except that x=0.06.

The results are shown in Table 2.

Comparative Example 5

The experiment similar to the example 1 was conducted, except that the MgxAg1-x layer 22 was not formed. The results are shown in Table 2.

Comparative Example 6

The experiment similar to the example 1 was conducted, except that the $Mg_{0.001}Ag_{0.999}$ layer 22 had a thickness of 39.2 nanometers. The results are shown in Table 3.

Comparative Example 7

The experiment similar to the example 1 was conducted, except that ZnO nanoparticles having an average particle diameter (d50) of 2.2 nanometers were applied on the transparent substrate body 21 by a spin-coater method, instead of the MgxAg1-x layer 22. The formed layer had a thickness of 2.2 nanometers. The ZnO nanoparticles were synthesized by a sol-gel method. The results are shown in Table 3.

TABLE 1

|  | Example 1 | Example 2 | Example 3 | Example 4 | Example 5 |
|---|---|---|---|---|---|
| Value of x | 0.001 | 0.001 | 0.001 | 0.001 | 0.045 |
| Thickness of MgXAg1-x layer 22 | 2.0 nm | 13.0 nm | 2.0 nm | 2.0 nm | 2.1 nm |
| $Zn(NO_3)_2$ concentration | 0.1M | 0.1M | 0.05M | 0.75M | 0.1M |
| HMT concentration | 0.1M | 0.1M | 0.05M | 0.75M | 0.1M |
| R2 (unit: nanometer) | 169 | 175 | 105 | 523 | 203 |
| R1 (unit nanometer) | 121 | 125 | 95 | 291 | 135 |
| R2/R1 ratio | 1.4 | 1.4 | 1.1 | 1.8 | 1.5 |
| Ra (unit nanometer) | 20 | 489 | 20 | 870 | 126 |
| Photoelectric conversion efficiency | 9.1% | 9.2% | 9.7% | 10.8% | 9.7% |

TABLE 2

|  | Comparative example 1 | Comparative example 2 | Comparative example 3 | Comparative example 4 | Comparative example 5 |
|---|---|---|---|---|---|
| Value of x | 0.001 | 0.001 | 0.0005 | 0.05 | — |
| Thickness of MgxAg1-x layer 22 | 2.0 nm | 2.0 nm | 2.1 nm | 2.1 nm | — |
| $Zn(NO_3)_2$ concentration | 0.01M | 1M | 0.1M | 0.1M | 0.1M |
| HMT concentration | 0.01M | 1M | 0.1M | 0.1M | 0.1M |
| R2 (unit: nanometer) | 87 | 735 | 137 | 258 | — |
| R1 (unit: nanometer) | 86 | 347 | 114 | 134 | — |
| R2/R1 ratio | 1.01 | 2.12 | 1.20 | 1.92 | — |
| Ra (unit: nanometer) | 4 | 1589 | 22 | 42 | — |
| Photoelectric conversion efficiency | 7.2% | 7.1% | 6.9% | 7.0% | 7.7% |

TABLE 3

|  | Comparative example 6 | Comparative example 7 |
|---|---|---|
| Value of x | 0.001 | — |
| Thickness of MgxAg1-x layer 22 | 39.2 nm | — |
| $Zn(NO_3)_2$ concentration | 0.1M | 0.1M |
| HMT concentration | 0.1M | 0.1M |
| R2 (unit: nanometer) | 158 | 150 |
| R1 (unit: nanometer) | 132 | 125 |
| R2/R1 ratio | 1.2 | 1.2 |
| Ra (unit: nanometer) | 725 | 428 |
| Photoelectric conversion efficiency | 7.3% | 7.1% |

As is clear from Table 1, Table 2, and Table 3, if all of the following requirements (A) to (D) are satisfied, the solar cell element 9 had a high photoelectric conversion efficiency.

Requirement (A): The value of x is not less than 0.001 and not more than 0.045. See the comparative example 3 and the comparative example 4.

Requirement (B): The MgxAg1-x layer 22 has a thickness of not less than 2 nanometers and not more than 13 nanometers. See the comparative example 6.

Requirement (C): The ZnO layer 23 had a value of Ra of not less than 20 and not more than 870 nanometers. See the comparative example 1 and comparative example 2.

Requirement (D): The R2/R1 ratio falls within a range of not less than 1.1 and not more than 1.8. See the comparative example 1, the comparative example 2 and the comparative example 4.

The present disclosure provides a solar cell element having high photoelectric conversion efficiency.

The invention claimed is:

1. A method for generating an electric power using a solar cell element, the method comprising:
    (a) preparing the solar cell element comprising:
        a transparent substrate body;
        a MgxAg1-x layer;
        a ZnO layer;
        a transparent conductive layer;
        a photoelectric conversion layer including an n-type semiconductor layer and a p-type semiconductor layer;
        an n-side electrode; and
        a p-side electrode;
    wherein the transparent substrate body, the MgxAg1-x layer, the ZnO layer, the transparent conductive layer, and the photoelectric conversion layer are stacked in this order;

the n-side electrode is electrically connected to the n-type semiconductor layer;

the p-side electrode is electrically connected to the p-type semiconductor layer;

x represents a value of not less than 0.001 and not more than 0.045;

the MgxAg1-x layer has a thickness of not less than 2 nanometers and not more than 13 nanometers;

the ZnO layer has an arithmetic mean roughness of not less than 20 nanometers and not more than 870 nanometers;

the ZnO layer is composed of a plurality of ZnO columnar crystal grains grown on a surface of the MgxAg1-x layer;

each ZnO columnar crystal grain has a longitudinal direction along a normal line direction of the transparent substrate body;

each ZnO columnar crystal grain has a width which increases from the MgxAg1-x layer toward the transparent conductive layer;

the width of each ZnO columnar crystal grain appears by cutting each ZnO columnar crystal grain along the normal line direction of the transparent substrate body; and each ZnO columnar crystal grain has a R2/R1 ratio of not less than 1.1 and not more than 1.8;

where R1 represents a width of a first end of the ZnO columnar crystal grain, the first end being in contact with the surface of the MgxAg1-x layer; and R2 represents a width of a second end of the ZnO columnar crystal grain; and (b) irradiating the photoelectric conversion layer with light through the transparent substrate body, the MgxAg1-x layer, the ZnO layer, and the transparent conductive layer, so as to generate electric power between the n-side electrode and the p-side electrode.

2. The method according to claim 1, wherein the solar cell element further comprises a reverse surface electrode layer; and the photoelectric conversion layer is interposed between the n-type semiconductor layer and the reverse surface electrode layer.

3. The method according to claim 1, wherein the n-type semiconductor layer is interposed between the transparent conductive layer and the p-type semiconductor layer; and the p-type semiconductor layer is interposed between the n-type semiconductor layer and the reverse surface electrode layer.

4. The method according to claim 1, wherein the n-side electrode is formed on the transparent conductive layer; and the p-side electrode is formed on the reverse surface electrode layer.

5. The method according to claim 1, wherein the ZnO layer has a volume resistivity of not less than $1 \times 10^{-3}$ $\Omega \cdot cm$.

6. The method according to claim 1, wherein the transparent conductive layer has a volume resistivity of less than $1 \times 10^{-3}$ $\Omega \cdot cm$.

7. The method according to claim 1, wherein the ZnO layer has a volume resistivity of not less than $1 \times 10^{-3}$ $\Omega \cdot cm$, the transparent conductive layer is formed of ZnO having a volume resistivity of less than $1 \times 10^{-3}$ $\Omega \cdot cm$.

8. The method according to claim 1, wherein the light is sunlight.

9. A solar cell element comprising:

a transparent substrate body;

a MgxAg1-x layer;

a ZnO layer;

a transparent conductive layer;

a photoelectric conversion layer including an n-type semiconductor layer and a p-type semiconductor layer;

an n-side electrode; and a p-side electrode;

wherein the transparent substrate body, the MgxAg1-x layer, the ZnO layer, the transparent conductive layer, and the photoelectric conversion layer are stacked in this order;

the n-side electrode is electrically connected to the n-type semiconductor layer;

the p-side electrode is electrically connected to the p-type semiconductor layer;

x represents a value of not less than 0.001 and not more than 0.045;

the MgxAg1-x layer has a thickness of not less than 2 nanometers and not more than 13 nanometers;

the ZnO layer has an arithmetic mean roughness of not less than 20 nanometers and not more than 870 nanometers;

the ZnO layer is composed of a plurality of ZnO columnar crystal grains grown on a surface of the MgxAg1-x layer;

each ZnO columnar crystal grain has a longitudinal direction along a normal line direction of the transparent substrate body;

each ZnO columnar crystal grain has a width which increases from the MgxAg1-x layer toward the transparent conductive layer;

the width of each ZnO columnar crystal grain appears by cutting each ZnO columnar crystal grain along the normal line direction of the transparent substrate body; and each ZnO columnar crystal grain has a R2/R1 ratio of not less than 1.1 and not more than 1.8;

where R1 represents a width of a first end of the ZnO columnar crystal grain, the first end being in contact with the surface of the MgxAg1-x layer; and R2 represents a width of a second end of the ZnO columnar crystal grain.

10. The solar cell according to claim 9, wherein the solar cell element further comprises a reverse surface electrode layer; and the photoelectric conversion layer is interposed between the n-type semiconductor layer and the reverse surface electrode layer.

11. The solar cell according to claim 9, wherein the n-type semiconductor layer is interposed between the transparent conductive layer and the p-type semiconductor layer; and the p-type semiconductor layer is interposed between the n-type semiconductor layer and the reverse surface electrode layer.

12. The solar cell according to claim 9, wherein the n-side electrode is formed on the transparent conductive layer; and the p-side electrode is formed on the reverse surface electrode layer.

13. The solar cell according to claim 9, wherein the ZnO layer has a volume resistivity of not less than $1 \times 10^{-3}$ $\Omega \cdot cm$.

14. The solar cell according to claim 9, wherein the transparent conductive layer has a volume resistivity of less than $1 \times 10^{-3}$ Ω·cm.

15. The solar cell according to claim 9, wherein the ZnO layer has a volume resistivity of not less than $1 \times 10^{-3}$ Ω·cm, the transparent conductive layer is formed of ZnO having a volume resistivity of less than $1 \times 10^{-3}$ Ω·cm.

\* \* \* \* \*